United States Patent [19]

Hirayama et al.

[11] Patent Number: 4,661,960
[45] Date of Patent: Apr. 28, 1987

[54] SEMICONDUCTOR LASERS

[75] Inventors: Noriyuki Hirayama, Kawasaki; Masaaki Ohshima, Yokohama; Naoki Takenaka; Yoshihiro Kino, both of Kawasaki, all of Japan

[73] Assignee: Matsushita Electric Industrial Co., Ltd., Osaka, Japan

[21] Appl. No.: 657,436

[22] Filed: Oct. 3, 1984

[30] Foreign Application Priority Data

Oct. 7, 1983 [JP] Japan ................... 58-189120

[51] Int. Cl.$^4$ ............................................. H01S 3/19
[52] U.S. Cl. ........................................ 372/45; 372/46; 357/17
[58] Field of Search ................. 372/45, 46, 43, 48; 357/17

[56] References Cited

U.S. PATENT DOCUMENTS 4,561,096 12/1985 Namizaki et al. .................. 372/46

OTHER PUBLICATIONS

Ishikawa et al., "V-Grooved Substrate Buried Heterostructure InGaAsP/InP Laser by One Step Epitaxy", J. Appl. Phys. 53(4) Apr. 1982, pp. 2851-2833.
"Shunt Current and Excess Temperature Sensitivity of $1_{th}$ and $\eta_{ex}$ in 1.3 μm InGaAsP DH Lasers," Namazaki et al., Electronic Letters Aug. 5, 1982, vol. 18, No. 16, pp. 703-705.
"Stable Longitudinal-Mode InGaAsP/InP Internal-Reflection-Interference Laser," Ohshima et al., IEEE Journal of Quantom Electronics, vol. QE-21, No. 6, Jun. 1985, pp. 563-567.
"Degradation Mechanism in 1.3 μm InGaAsP/InP Buried Crescent Laser Diode at a High Temperature," Oomura et al., Electronics Letters May 26, 1983, vol. 19, No. 11.
"V-Grooved Substrate Buried Heterostructure InGaAsP/InP Laser Emitting at 1.3 μm Wavelength," Ishikawa et al., IEEE Transactions on Microwave Theory and Techniques, vol. MTT-30, No. 10, Oct. 1982, pp. 1692-1699.
"Reproducibility of Low Carrier Concentration in LPE InP Using Batch Melts," Yamazaki et al., J. of Crystal Growth 61 (1983), pp. 289-294.
"Low-Temperature Zn- and Cd-Diffusion Profiles in InP and Formation of Guard Ring in InP Avalanche Photodiodes," Ando et al., IEEE Transactions on Electron Devices, vol. ED-29, No. 9, Sep. 1982, pp. 1408-1413.
"V-Grooved Substrate Buried Heterostructure InGaAsP/InP Laser," Electronics Letters, Jun. 25, 1981, vol. 17, No. 13, pp. 465-467.

Primary Examiner—James W. Davie
Assistant Examiner—Georgia Y. Epps
Attorney, Agent, or Firm—Spencer & Frank

[57] ABSTRACT

A semiconductor laser comprising in the direction parallel to a junction on both sides of a stripe-shaped active layer of double-hetero structure a semi-insulating current blocking layer which has a refractive index smaller than that of the active layer and of which the resistance is increased by doping of an impurity.

8 Claims, 12 Drawing Figures

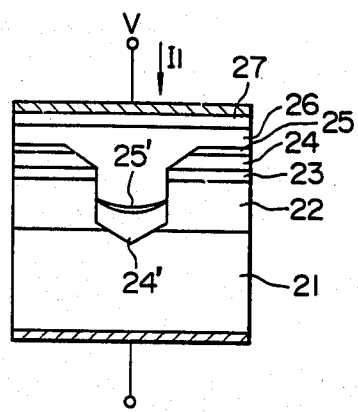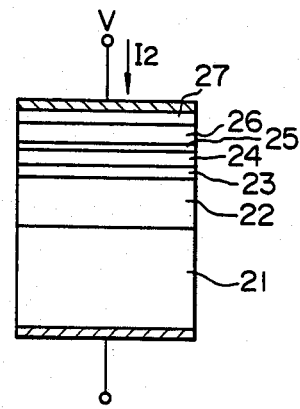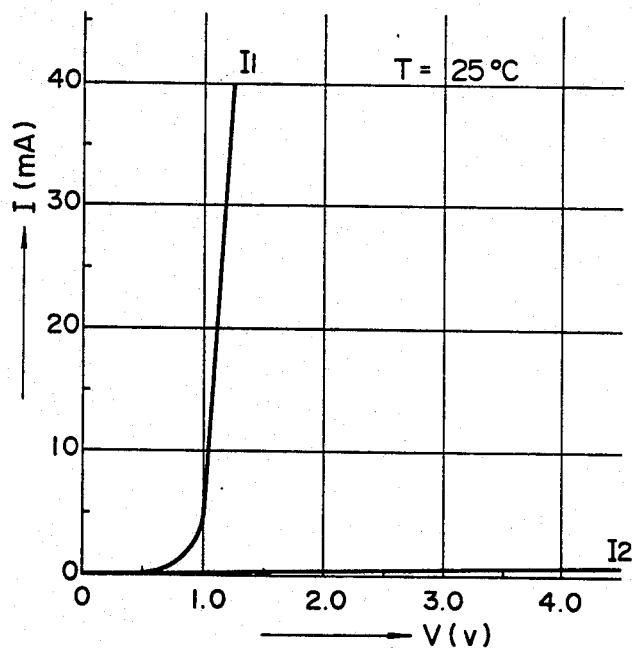

SEMICONDUCTOR LASERS

BACKGROUND OF THE INVENTION

This invention relates to semiconductor lasers for use as light sources in optical-fiber communication systems.

A semiconductor laser suitable for use in optical-fiber communication systems must have a low threshold current value, stably oscillate in the single transversal mode and so on. Therefore, the generally used semiconductor lasers are constructed to provide, in the direction parallel to the junction and adjacent to a stripe-shaped active layer of double hetero structure, several semiconductor layers including current-blocking layers of which the refractive index is smaller than that of the active layer, for the purpose of confining light and current within the active layer. FIGS. 1A and 1B show typical examples thereof. FIG. 1A is a schematic cross-sectional diagram of a so-called BC-structure semiconductor laser (buried-crescent laser, hereinafter abbreviated BC laser), and FIG. 1B is a schematic cross-sectional diagram of a so-called BH structure semiconductor laser (buried-hetero structure laser, hereinafter abbreviated BH laser).

In FIG. 1A, there are shown an n-type InP substrate 1, an n-type InP layer 2, a B-type InP layer 3, an n-type InP layer 4, an n-type InP clad layer 5, an n-type InGaAsP active layer 6, a p-type InP clad layer 7, a p-type InGaAsP cap layer 8 and ohmic electrodes 9 and 10. The confinement of current within the n-type InGaAsP active layer 6 is carried out by the p-n junction which is reverse-biased by the bias applied to the laser diode of the p-type InP layer 3 and the n-type InP layer 4 formed on the layer 3.

The BC laser, as described, for example, in Electronics Letters, 5th August, 1982 Vol. 18, No. 16, pp. 703–705, has a thyristor structure, p-n-p-n junction formed of the InP layers 2, 3, 4 and 7 which structure is turned on to allow leakage current to flow as indicated by $I_{L1}$ in FIG. 1A even when a small leakage current flows in the p-type InP layer 3, forming the gate of the thyrister, at a high temperature. In order to make it difficult to turn on the thyristor, it is necessary to precisely control the thickness of each InP layer 2, 3, 4, 7 and the carrier concentration and therefore the growth process is complicated. Also, as described in Electronics Letters, 26th May, 1983, Vol. 19 No. 11, pp. 407–408, when the p-n junction formed by the p-type InP layer 3 and the n-type InP clad layer 5, lying along the wall of the groove in n-type InGaAsP active layer 6 is buried, is deteriorated, the diffusion potential decreases to a value lower than that of the junction formed n-type InGaAsP active layer 6 and the P-type InP clad layer 7, with the result that the leakage current flows as indicated by $I_{L2}$ in FIG. 1A. These leakage currents are relatively large as compared with the current flowing in the n-type InGaAsP active layer 6, thus causing an increase in the threshold current value, saturation in the high output side of the laser output, decrease in the quantum efficiency, and so on.

In FIG. 1B, there are shown an n-type InP substrate 11, an n-type InP clad layer 12, an n-type InGaAsP active layer 13, a p-type InP clad layer 14, a p-type InGaAsP cap layer 15, a p-type InP layer 16, an n-type InP layer 17, and ohmic electrodes 18 and 19. The BH laser has also a thyristor structure, p-n-p-n junction formed by the InP layers 12, 16, 17 and 14 and thus has leakage currents $I_{L1}$ and $I_{L2}$ as in the case of the BC laser shown in FIG. 1A. The confinement of current within the active layer is generally performed by providing several layers having at least one p-n junction which is reverse-biased by the bias applied to the laser diode, to be adjacent to a stripe-shaped active layer of double hetero structure in the direction parallel to the junction. However, the two or more layers having at least one such p-n junction can not avoid the leakage currents $I_{L1}$ and $I_{L2}$ due to the structures shown in FIGS. 1A and 1B. The leakage currents are also caused by deterioration of the reverse-biased junction itself and any defect caused in the junction interface upon crystal growth.

SUMMARY OF THE INVENTION

It is an object of the invention to provide a semiconductor laser capable of reducing the leakage currents which are caused due to its structure by providing a low carrier concentration layer on both sides by a stripe-shaped active layer.

The feature of this invention is that an InP layer which has a lower refractive index than the refractive index of an InGaAsP active layer and is increased in its resistance by doping cadmium (Cd) is provided as a semi-insulating current blocking layer on both sides of the stripe-shaped InGaAsP active layer in the direction parallel to the junction.

BRIEF DESCRIPTION OF THE DRAWINGS

FIGS. 5A to 5C are respectively a cross-sectional diagram of a laser diode chip shown in FIG. 2, a cross-sectional diagram of a laser chip with no stripe-shaped active layer, and a graph for current-voltage characteristics of both chips.

DESCRIPTION OF THE PREFERRED EMBODIMENTS

Figure 1A:
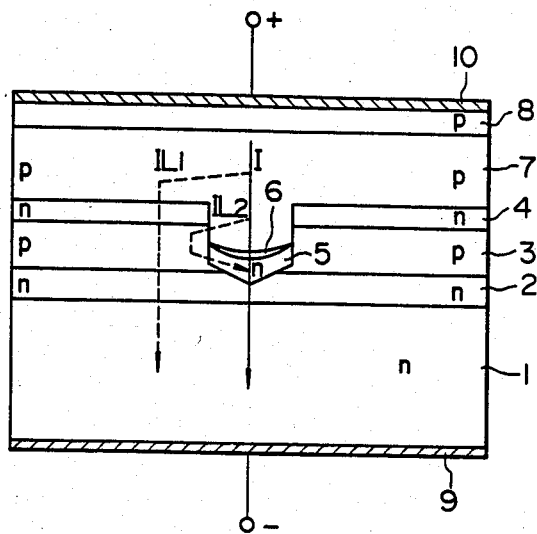
FIG. 1A is a schematic cross-sectional diagram of a conventional BC-structure semiconductor laser in which current blocking layers having p-n junctions are provided.
Figure 1B:
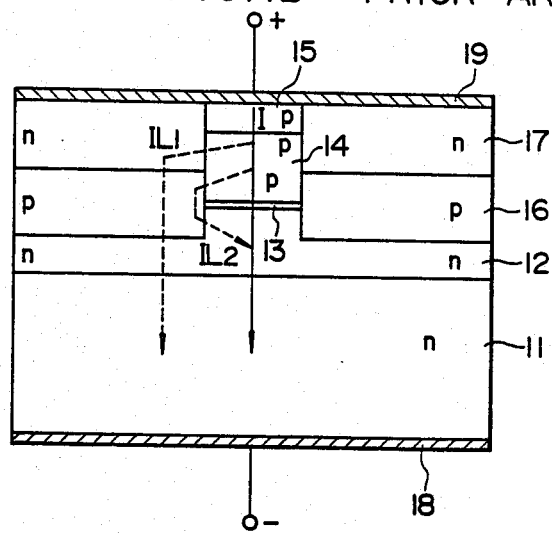
FIG. 1B is a schematic cross-sectional diagram of a conventional BH-structure semiconductor laser in which current blocking layers having p-n junctions are provided.
Figure 2:
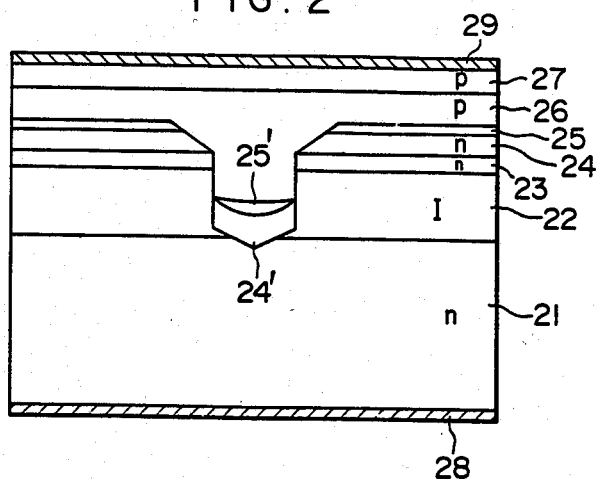
FIG. 2 is a cross-sectional diagram of a semiconductor laser having a semi-insulating current blocking layer as one embodiment of this invention.

FIG. 2 is a cross-sectional diagram of a 1.3-μm band InGaAsP/InP system semiconductor laser as one embodiment of this invention. Referring to FIG. 2, there are shown a (100) oriented n-type InP substrate 21, a Cd-doped semi-insulating InP current blocking layer 22, an n-type InGaAsP layer 23, an n-type InP clad layer 24, an InGaAsP active layer 25, a p-type InP clad layer 26, a p-type InGaAsP cap layer 27 and ohmic electrodes 28 and 29.

Figure 3A:
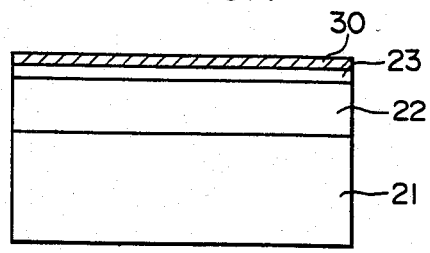
FIGS. 3A to 3C show manufacturing processes for the semiconductor laser of FIG. 2.
Figure 3B:
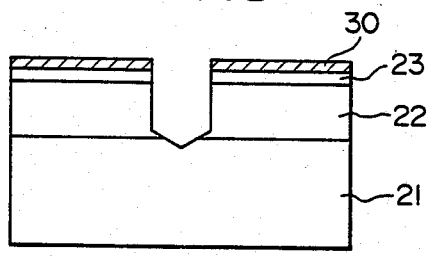
Figure 3C:
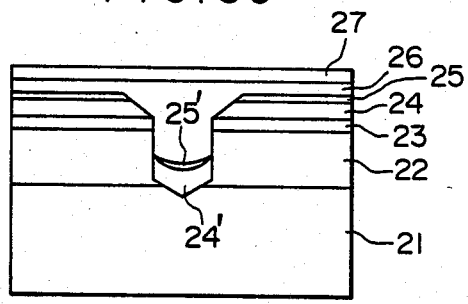

The semiconductor laser of this embodiment is produced by two liquid phase epitaxial crystal-growing process steps. FIGS. 3A to 3C are cross-sectional diagrams of the semiconductor laser at each process. At the first crystal-growing step, as shown in FIG. 3A, the Cd-doped semi-insulating InP current blocking layer 22 and then the n-type InGaAsP P layer 23 are grown on the (100) oriented n-type InP substrate 21 in turn. In addition, an SiO$_2$ film 30 is formed on the layer 23 in order to mask the area other than the portion in which a groove is to be formed by etching and in which the second step for burying growth is then performed. In the SiO$_2$ film 30 are formed stripe-shaped windows in the <011>-direction by normal photolithography. When a photomask having a 1-μm wide stripe pattern is used, the width of the stripe-shaped window is normally 1.5 μm or less. Then, the grown layers under the windows of the mask of the SiO$_2$ film 30 are etched away by two different etchants to form grooves. First, the n-type InGaAsP layer 23 is etched away by an etching solution of H$_2$SO$_4$+H$_2$O$_2$+H$_2$O (3:1:1). This n-type InGaAsP layer 23 is provided to protect the surface of the Cd-doped semi-insulating InP current blocking layer 22 from being damaged thermally and to protect the InP layer from being overetched away to form wider grooves by a generally used etchant of HCl solution, Br+CH$_3$OH solution, H$_3$PO$_4$+HCl solution or HBr+H$_2$O$_2$ solution if the InP layer is formed directly under the mask comprising the SiO$_2$ film. The width of the groove resulting from etching of the n-type InGaAsP layer 23 is normally 1.5 μm or below because the layer 23 is not overetched away.

Subsequently, the Cd-doped semi-insulating InP current blocking layer 22 is etched away by an etchant consisting of HCl or H$_3$PO$_4$+HCl solution so that by considering the etching speed and the thickness of the layer 22 the grooves are sure to reach the (100) oriented n-type InP substrate 21. The grooves thus formed are normally 1.5 μm or less in width at the opening portion of the n-type InGaAsP layer 23 and, 2.0 μm or less in width at the lower portion, that is, they are V-shaped at the bottom portion as shown in FIG. 3B.

Then, after removal of the SiO$_2$ film 30, the second step of crystal growth is performed; that is, the n-type InP clad layer 24, 24', the InGaAsP active layer 25, 25', the P-type InP clad layer 26, and then the p-type InGaAsP cap layer 27 are grown as shown in FIG. 3C. In this step, the n-type InP clad layer 24' and the InGaAsP active layer 25' are completely buried in the bottoms of the grooves, and the clad layer 24 and active layer 25 are formed on the layer 23. They are discontinuous at the opening portions of the grooves as illustrated. The InGaAsP active layer 25' is buried in the groove at approximately ½ the thickness of the Cd-doped semi-insulating InP current blocking layer 22. Finally, the cap layer 27 and the substrate 21 are provided with ohmic electrodes 28 and 29, a cleavage is formed and a resonator is thereby provided in chip form.

In the semiconductor laser of this embodiment, since the Cd-doped semi-insulating InP layer 22 provided on both sides of the stripe-shaped active layer has a relatively high specific resistance, electric current flowing from the p-type InP clad layer 26 can be made very small at the usual semiconductor laser drive voltages. Accordingly, it becomes possible to prevent turn-on of the p-n-p-n type thyrister structure formed of the p-type InP clad layer 26, n-type InGaAsP active layer 25, n-type InP clad layer 24, n-type InGaAsP layer 23, Cd-doped semi-insulating InP layer 22 and n-type InP substrate 21. The flow of leakage current bypassing the active layer and flowing through the p-type InP clad layer 26, Cd-doped semi-insulating InP layer 22 and n-type InP clad layer 24' is prevented.

Figure 4:
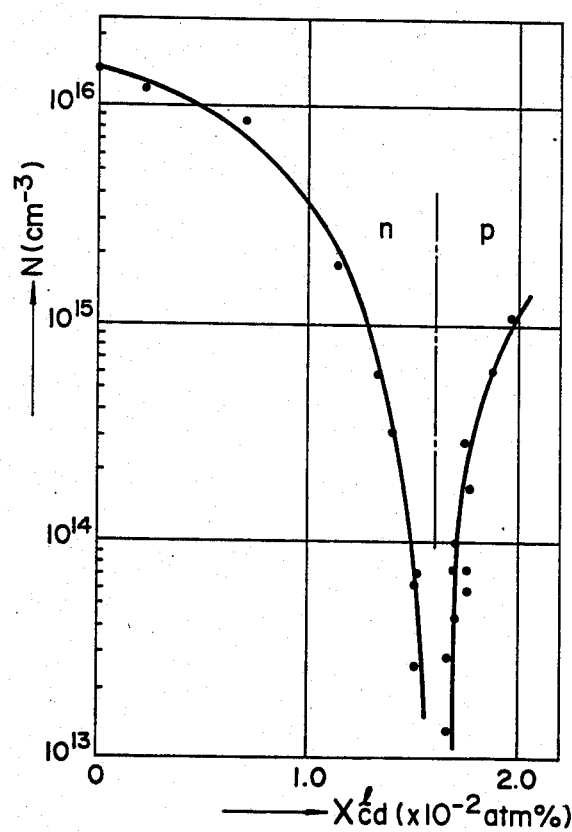
FIG. 4 is a graph showing the relation between the carrier concentration and the amount of doped Cd in the Cd-doped InP layer.

The InP grown layer 22 having no intentional impurity doping usually has n-type conductivity because of n-type residual impurities. When InP is doped with cadmium (Cd) as an impurity material, it develops p-type conductivity. However, as compared with zinc (Zn) which is normally used as an impurity for making the InP exhibit p-type conductivity, the segregation factor of the cadmium (Cd) is reduced by two figures. Therefore, compensation for the n-type residual impurity can be well controlled and hence it is possible to form a high-resistance layer of low carrier concentration. FIG. 4 shows the relation between the carrier concentration and the amount of Cd dopant, derived from the measurements of Hall and C (capacitance) − V (voltage) characteristic in the InP grown layer 22 with Cd doping. The growth solution (In+InP+Cd) was baked at 680° C. for two hours in a H$_2$ atmosphere. The ordinate represents the carrier concentration and the abscissa is the amount of Cd dopant, expressed by the ratio of the number of Cd atoms to the total number of atoms (In+P+Cd). From FIG. 4 it will be seen that as the amount of Cd dopant increases, the carrier concentration decreases as a result of the compensation for the n-type residual impurity and changes from n-type to P-type conductivity at around $1.6 \times 10^{-2}$ atm% where a semi-insulating layer of very large resistivity is formed. The relation between resistivity ρ and carrier concentration N is expressed by $$\rho = 1/N\mu q \text{ (}\mu\text{: mobility, } q\text{: unit charge)}$$

Since the mobility of a holes is smaller than that of electrons, the resistivity of an P-type layer becomes larger than that of n-type layer even though the carrier concentration of P type is apparently the same as that of n-type. Therefore, when a high-resistance InP grown layer is formed, it is necessary to dope the InP layer with $1.6 \times 10^{-2}$ atm% or slightly above, of Cd. FIG. 5A is a cross-sectional diagram of one of the laser diode chips formed in a same wafer by the above-mentioned crystal growth process and by providing a current blocking layer with $1.75 \times 10^{-2}$ atm% of Cd doped, and FIG. 5B is a cross-sectional diagram of such a chip having no stripe-shaped active layer. As seen from FIG. 4, the p-type InP growth layer exhibits a carrier concentration of $4 \times 10^{14}$ cm$^{-3}$ with $1.75 \times 10^{-2}$ atm% of Cd doping. FIG. 5C shows I-V characteristic curves I$_1$ and I$_2$ of the chips. I$_1$ is the I-V characteristic of the laser diode in FIG. 5A and I$_2$ is the I-V characteristic of the chip in FIG. 5B. From FIG. 5C it will be seen that the current I$_2$ flowing through the current blocking layer is negligibly small under a normal voltage of about 2 V applied to the semiconductor laser. Thus, an good excellent high resistance layer can be realized.

Figure 6:
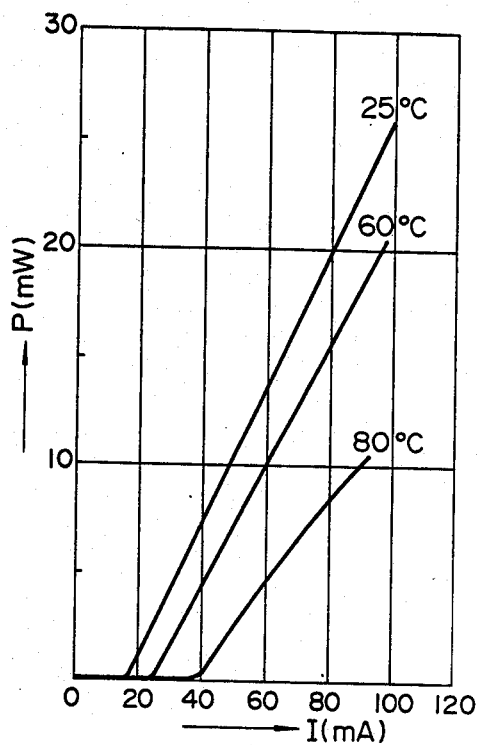
FIG. 6 is a graph showing the relation between the laser output and operating current for different temperatures, in the semiconductor laser of FIG. 2.

FIG. 6 shows P(laser output)-I (operating current) characteristic curves at temperatures of 25° C., 60° C. and 80° C., of the semiconductor laser according to this embodiment. From FIG. 6, it will be seen that the characteristics have good linearity up to high temperatures, and are little saturated at the high output side. The average threshold current at a room temperature of T=25° C. was as low as 15 mA, and the minimum threshold current was 9 mA. From these results, it was confirmed that the Cd-doped InP current blocking layer has good characteristics. Also, since the current blocking layer in the semiconductor laser of this structure is not multilayer, the possibility that defects are introduced in the interface upon crystal growing is reduced and thus the yield at which laser diodes are produced from a single wafer is greatly improved.

Figure 7:
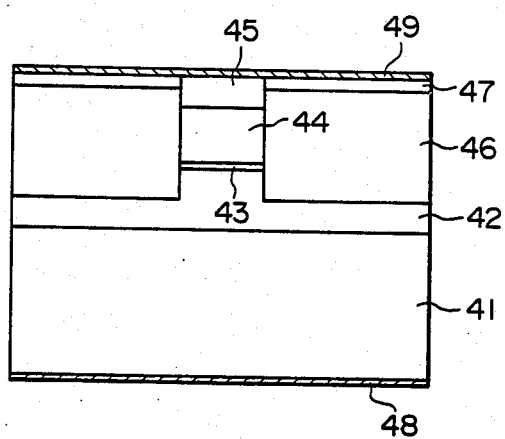
FIG. 7 is a cross-sectional diagram of another embodiment of this invention.

FIG. 7 is a cross-sectional diagram of an InGaAsP/InP semiconductor laser of another embodiment of this invention. Referring to FIG. 7, there are shown an n-type InP substrate 41, an n-type InP clad layer 42, an n-type InGaAsP active layer 43, a p-type InP clad layer 44, a P-type InGaAsP cap layer 45, a Cd-doped semi-insulating InP current blocking layer 46, an n-type InGaAsP layer 47, and ohmic electrodes 48 and 49. The n-type InGaAsP layer 47 is provided to protect the surface of the Cd-doped semi-insulating InP current blocking layer from being thermally damaged by heat. Also in this embodiment, the Cd-doped semi-insulating InP current blocking layer has a good characteristics as in the embodiment shown in FIG. 2.

According to this invention, since a semi-insulating current blocking layer is provided adjacent to a stripe-shaped active layer of double-hetero structure in the direction parallel to the junction, which current blocking layer has a refractive index smaller than that of the active layer and has a high resistance due to a Cd impurity doped therein, it is possible to provide a semiconductor laser which exhibits an extremely good performance wherein leakage currents due to the structure and junction deterioration, defects in the junction interface and so on are substantially eliminated.

What is claimed is:

1. In a semiconductor laser having a resonant cavity, the combination comprising;
   an n-type InP substrate;
   a p-type InP current blocking layer having a carrier concentration in the range $1.2 \times 10^{13}$ to about $10^{15}$ cm$^{-3}$, said p-type InP layer having a stripe-shaped groove cut therein and penetrating into said substrate;
   an n-type InP clad layer disposed in the bottom of said groove in contact with said substrate;
   an InGaAsP active layer formed on said n-type InP clad layer and disposed within said groove;
   a p-type InP clad layer formed over said InGaAsP active layer to at least partially fill said groove; and
   first and second electrodes affixed to said n-type InP substrate and said p-type InP clad layer respectively, a voltage for operating said laser being applied across said first and second electrodes.

2. A semiconductor laser according to claim 1, wherein said current blocking layer is a cadmium-doped liquid-phase epitaxial growth layer.

3. A semiconductor laser according to claim 2, wherein the p-type conductivity of said InP current blocking layer is obtained by converting n-type InP to p-type InP by compensating said n-type InP with a cadmium dopant, said conversion from n-type to p-type occurring just after the amount of said cadmium dopant is increased above a predetermined amount.

4. A semiconductor laser according to claim 3, wherein the predetermined amount of cadmium dopant at which said InP current blocking layer is converted from n-type to p-type is about $1.6 \times 10^{-2}$ atm%.

5. A semiconductor laser according to claim 3, wherein the resistivity of said current blocking layer is sufficiently high to block leakage currents which would otherwise flow therethrough and bypass said InGaAsP active layer.

6. In a semiconductor laser having a resonant cavity, the combination comprising:
   an n-type InP substrate;
   a p-type InP current blocking layer having a stripe-shaped groove cut therein and penetrating into said substrate, said InP current blocking layer being a liquid-phase epitaxial growth layer doped with cadmium and having a carrier concentration in the range $1.2 \times 10^{13}$ to about $10^{15}$ cm$^{-3}$, the p-type conductivity of said InP current blocking layer being obtained by converting n-type InP to p-type InP by compensating said n-type InP with said cadmium dopant, said conversion from n-type to p-type occurring just after the amount of cadmium dopant is increased above a predetermined amount;
   an n-type InP clad layer disposed in the bottom of said groove in contact with said substrate;
   an InGaAsP active layer formed on said n-type InP clad layer and disposed within the groove;
   a p-type InP clad layer formed over said InGaAsP active layer to at least partially fill said groove; and
   first and second electrodes affixed to said n-type InP substrate and said p-type InP clad layer respectively, a voltage for operating said laser being applied across said first and second electrodes.

7. In a semiconductor laser having a resonant cavity, the combination comprising:
   an n-type InP substrate;
   a cadmium-doped p-type InP current blocking layer having a stripe-shaped groove cut therein and penetrating into said substrate, said current blocking layer being a cadmium-doped liquid-phase epitaxial growth layer having a carrier concentration in the range shown in FIG. 4 for causing p-type conductivity thereof;
   an n-type InP clad layer disposed in the bottom of said groove in contact with said substrate;
   an InGaAsP active layer formed on said n-type InP clad layer and disposed within said groove;
   a p-type InP clad layer formed over said InGaAsP active layer to at least partially fill said groove; and
   first and second electrodes affixed to said n-type InP substrate and said p-type InP clad layer respectively, a voltage for operating said laser being applied across said first and second electrodes.

8. A semiconductor laser according to claim 7, wherein said InP current blocking layer is doped with $1.6 \times 10^{-2}$ atm% to $2.0 \times 10^{-2}$ atm% of cadmium.

* * * * *